(12) United States Patent  (10) Patent No.: US 7,130,002 B2
Seo et al.  (45) Date of Patent: Oct. 31, 2006

(54) LCD WITH METAL DIFFUSED INTO THE INSULATING LAYER OVER THE CHANNEL AREA

(75) Inventors: Hyun Sik Seo, Ahnyang-shi (KR); Hae Yeol Kim, Uiwang-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 92 days.

(21) Appl. No.: 10/875,564

(22) Filed: Jun. 25, 2004

(65) Prior Publication Data

US 2004/0263707 A1  Dec. 30, 2004

(30) Foreign Application Priority Data

Jun. 28, 2003  (KR)  ...................... 10-2003-0042943

(51) Int. Cl.
*G02F 1/136* (2006.01)

(52) U.S. Cl. .............................. 349/43; 257/72; 438/20

(58) Field of Classification Search .................. 349/43
See application file for complete search history.

(56) References Cited

U.S. PATENT DOCUMENTS 6,617,648 B1 * 9/2003 Yamazaki et al. .......... 257/350

* cited by examiner

*Primary Examiner*—Andrew Schechter
*Assistant Examiner*—Lucy Chien
(74) *Attorney, Agent, or Firm*—McKenna Long & Aldridge LLP

(57) ABSTRACT

The present invention relates to a liquid crystal display panel and a fabricating method thereof that is capable of enhancing crystallization efficiency of an active layer and simplifying the fabricating process. A fabricating method of a liquid crystal display panel includes forming a gate electrode on a substrate; forming a gate insulating film on the gate electrode formed thereon; forming an amorphous silicon film on the gate insulating film; forming an insulating pattern on the amorphous silicon film; crystallizing the amorphous silicon film into a polycrystalline silicon film using a derivative metal, the polycrystalline silicon film having source, drain and channel areas, wherein the insulating pattern overlaps the channel area of the polycrystalline silicon film; and forming source and drain electrodes on the polycrystalline silicon film, wherein the source and the drain electrodes contacting the source and drain areas of the polycrystalline silicon film, respectively.

7 Claims, 36 Drawing Sheets

LCD WITH METAL DIFFUSED INTO THE INSULATING LAYER OVER THE CHANNEL AREA

This application claims the benefit of Korean Patent Application No. 2003-42943, filed on Jun. 28, 2003, which is hereby incorporated by reference for all purposes as if fully set forth herein.

BACKGROUND OF THE INVENTION

1. Field of the Invention

The present invention relates to a liquid crystal display panel using polycrystalline silicon, and more particularly, to a liquid crystal display panel and a method of fabricating thereof that is capable of enhancing the crystallization efficiency of an active layer and reducing the number of fabricating processes.

2. Discussion of the Related Art

Generally, liquid crystal displays (LCD) control the light transmittance of liquid crystal cells in accordance with video signals, thereby displaying pictures corresponding to the video signals on a liquid crystal display panel where the liquid crystal cells are arranged in a matrix form. In this case, a thin film transistor (TFT) is typically used as a switching device for the liquid crystal cells.

The semiconductor layer of such a thin film transistor is made of either amorphous silicon or polycrystalline silicon. Amorphous silicon TFTs have an advantage in that they have relatively better uniformity and stable property. However, the amorphous silicon TFTs also have a disadvantage in that response speed is slow because the carrier mobility of amorphous silicon is low. Thus, it is difficult to apply such amorphous silicon TFTs to a high resolution display panel requiring a rapid response speed or to a driving device for a gate driver and a data driver. In contrast, because the carrier mobility of polycrystalline silicon is high, polycrystalline silicon TFTs have drawn attention for the applications of liquid crystal display panels with a high resolution and peripheral driving circuits mounted in the display panels.

FIG. 1 and FIG. 2 are a plan view and a sectional view of a related art liquid crystal display panel having such a polycrystalline silicon TFT.

Referring to FIGS. 1 and 2, the liquid crystal display panel having the thin film transistor includes a gate line 2, a data line 4 crossing the gate line 2 with an insulating film 12 therebetween, a TFT 30 provided at a crossing of the gate line 2 and the data line 4, and a pixel electrode 22 provided in a pixel area defined by the crossing of the gate line 2 and the data line 4.

The gate line 2 applies a gate signal to a gate electrode 6 of the TFT 30. The data line 4 applies a pixel signal to the pixel electrode 22 via a drain electrode 10 of the TFT 30.

The TFT 30 includes the gate electrode 6 connected to the gate line 2, a source electrode 8 connected to the data line 4 and a drain electrode 10 connected, via a contact hole 20 passing through a passivation film 18, to the pixel electrode 22.

The gate electrode 6 is formed on a buffer film 16 so as to overlap a channel area 14C of the active layer, with the gate insulating film 12 between the gate electrode 6 and the channel area 14C. The source electrode 8 is formed to be insulated from the gate electrode 6 with the gate insulating film 12 therebetween and to be directly connected to a source area 14S of the active layer. The drain electrode 10 is formed to be insulated from the gate electrode 6 with the gate insulating film 12 therebetween and to be connected to a drain area 14D of the active layer. Different ions, depending on the location of the active layer 14 and type of the TFT 30, are injected into the active layer 14. In other words, if the TFT 30 has an N channel, at least one of $n^+$ and $n^-$ ions is injected into the active layer. The active layer to which the $n^-$ ions are injected becomes a Lightly Doped Drain (LDD) area, which is generally used to reduce the off-current of the TFT 30. The active layer into which the $n^+$ ions are injected becomes the source area and the drain area, and the active layer into which the $n^+$ and $n^-$ ions are not injected become the channel area. If the TFT 30 has a P channel, $p^+$ ions are injected into the active layer. While the active layer into which the $p^+$ ions are injected becomes the source and the drain areas, the active layer into which the $p^+$ ions are not injected become the channel area.

Such a TFT 30 responds to a scanning pulse applied from the gate line 2, to thereby allow a video signal, that is, a pixel signal applied from the data line 4, to be charged in a liquid crystal cell. As a result, the liquid crystal cell controls a light transmittance in accordance with the pixel signal.

As a result, an electric field is formed between the pixel electrode 22 to which the pixel signal is applied via the TFT 30 and a common electrode (not shown), which exists usually on the other substrate. Liquid crystal molecules between the pixel electrode 22 and the common electrode rotate in response to the electric field due to the dielectric anisotropy of the liquid crystal molecules. The degree of the rotation control the light transmittance of the pixel area, thereby displaying a picture.

FIGS. 3A to 3F are sectional views illustrating a fabricating process of a liquid crystal display having polycrystalline silicon TFTs.

Firstly, an insulating material such as silicon oxide $SiO_2$ is deposited on the entire lower substrate 1, thereby forming a buffer film 16, as shown in FIG. 3A. A gate metal layer is deposited on the entire surface of the lower substrate 1 with the buffer film 16 thereon, and then the gate metal layer is patterned by photolithography and etching processes including exposing and developing steps, thereby forming a gate electrode 6. The gate metal layer may be made of a metal including aluminum and aluminum/neodymium, etc.

A gate insulating material such as silicon oxide $SiO_2$ is deposited on the entire surface of the lower substrate 1 with the gate electrode 6 thereon, thereby forming a gate insulating film 12 as shown in FIG. 3B. Then, an amorphous silicon film is deposited on the surface of the lower substrate 1 with the gate insulating film 12 thereon. Hydrogen contained in the deposited amorphous silicon film is removed by a dehydrogenating process, which generally includes a thermal treatment step. After the dehydrogenating process, the amorphous silicon layer is crystallized by a laser annealing, in which the amorphous silicon layer turns into a polycrystalline silicon layer. The polycrystalline silicon layer is patterned by photolithography and etching processes including exposing and developing steps, thereby forming an active layer 14.

A photo-resist is deposited on the entire surface of the active layer 14 with the lower substrate 1 thereon, and then is patterned by photolithography and etching processes including exposing and developing steps, thereby forming a photo-resist pattern. A predetermined amount of an impurity ion is injected into the area except for a channel area 14C of the active layer using the photo-resist pattern as a mask, thereby forming a source area 14S and a drain area 14D of the active layer as shown in FIG. 3C.

Herein, in case of a N-type TFT, $n^+$ ions are injected into the active layer using a first photo-resist pattern as a mask, and n⁻ ions are injected into the active layer using a second photo-resist pattern having a narrower width than the first photo-resist pattern as a mask. Accordingly, in the active layer of the N-type TFT, the area into which the n⁺ and n⁻ ions are not injected becomes a channel area, the area into which the n⁻ ions are injected becomes an LDD area, and the area into which the n⁺ ions are injected becomes source and drain areas.

In case of a P-type TFT, p⁺ ions are injected into the active layer using a photo-resist pattern as a mask. Accordingly, in the active layer of P-type TFT, the area into which the p⁺ ions are not injected becomes a channel area, and the area into which the p⁺ ions are injected becomes source and drain areas.

A data metal layer is deposited on the entire surface of the lower substrate 1 with the channel area 14C, the source area 14S and the drain area 14D thereon, and then the data metal layer is patterned by photolithography and etching processes including exposing and developing steps, thereby forming a data line 4, source electrode 8 and a drain electrode 10, as shown in FIG. 3D.

An insulting material is deposited on the entire surface of the resultant lower substrate 1 with the data line 4, the source electrode 8 and the drain electrode 10 thereon, thereby forming a passivation film 18, as shown in FIG. 3E. Then, the passivation film 18 is patterned by photolithography and etching processes including exposing and developing steps, thereby forming a contact hole 20 exposing the drain electrode 10.

A transparent conductive material is deposited on the entire surface of the lower substrate 1 with the passivation film 18 thereon, and then the transparent conductive material is patterned by photolithography and etching processes including exposing and developing steps, thereby forming a pixel electrode 22, as shown in FIG. 3F. The pixel electrode 22 is electrically connected to the drain electrode 10 via the contact hole 20.

As described above, a fabricating method of the related art polycrystalline silicon TFT employs a six mask process, thereby complicating the fabricating process and increasing the fabrication costs. This is because each mask process includes a plurality of sub-processes, such as deposition, cleaning, photolithography, etching, photo-resist stripping and inspection. Accordingly, a fabricating method is needed and desirable that is simpler than the fabricating method of the related art allowing a reduced fabricating cost.

In addition, a laser annealing is mainly used to crystallize an amorphous silicon film into a polycrystalline silicon film. The laser annealing is a method to form a polycrystalline silicon film by irradiating a laser beam on an amorphous silicon film deposited on a substrate. In this method, laser energy of about tens or hundreds of ns is irradiated on an amorphous silicon film causing the amorphous silicon film to be in a melting condition, thereby forming a polycrystalline silicon. Although the crystallization method using the laser annealing has an advantage in that the crystallization can be performed at a low temperature, for example, at 400° C., the crystallization is not uniform. Further, it requires an expensive laser equipment, thereby decreasing productivity.

SUMMARY OF THE INVENTION

Accordingly, the present invention is directed to a liquid crystal display panel and a fabricating method thereof that substantially obviates one or more of the problems due to limitations and disadvantages of the related art.

An advantage of the present invention is to provide a liquid crystal display panel and a fabricating method thereof that is capable of enhancing the crystallization efficiency of an active layer and simplifying the fabricating process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a fabricating method of a liquid crystal display panel includes forming a gate electrode on a substrate; forming a gate insulating film on the gate electrode formed thereon; forming an amorphous silicon film on the gate insulating film; forming an insulating pattern on the amorphous silicon film; crystallizing the amorphous silicon film into a polycrystalline silicon film using a derivative metal, the polycrystalline silicon film having source, drain and channel areas, wherein the insulating pattern overlaps the channel area of the polycrystalline silicon film; and forming source and drain electrodes on the polycrystalline silicon film, wherein the source and the drain electrodes contacting the source and drain areas of the polycrystalline silicon film, respectively.

In another aspect of the present invention, a liquid crystal display panel includes a gate electrode on a substrate; a gate insulation layer on the gate electrode; an active pattern having a channel area and source drain areas, the channel area overlapping the gate electrode; an insulating pattern overlapping the channel area of the active pattern on the active pattern, wherein the insulating pattern includes a derivative metal being diffused into the insulating pattern during a heat treatment; and source and drain electrodes contacting the source and drain areas of the active pattern, respectively.

In yet another aspect of the present invention, a fabricating method of a liquid crystal display panel includes forming a gate electrode on a substrate; forming a gate insulating layer on the gate electrode; depositing an amorphous silicon film on the gate insulating layer; forming an insulating pattern on the amorphous silicon film; forming a derivative metal on the insulating pattern and the amorphous silicon film; crystallizing the amorphous silicon film into a polycrystalline silicon film, the polycrystalline silicon film having source, drain and channel areas; and forming source and drain electrodes on the polycrystalline silicon film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

Hereinafter, an embodiment of the present invention will be described in detail with reference to FIG. 4 to FIG. 13E.

Figure 1:
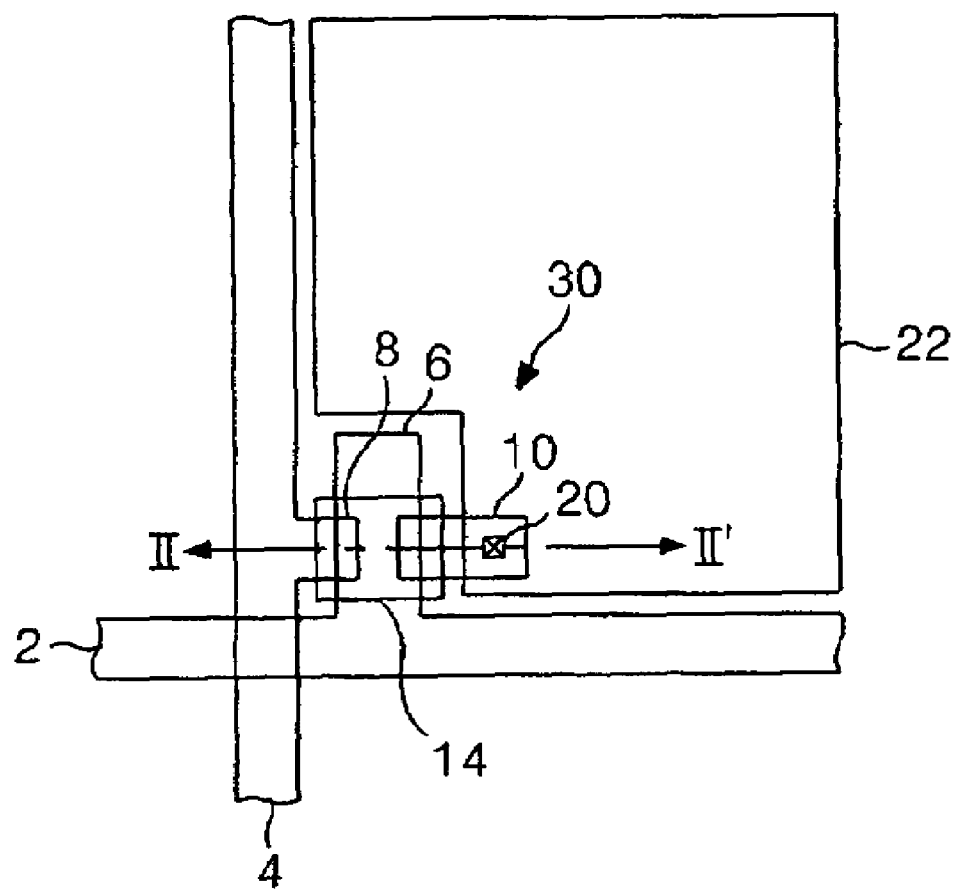
FIG. 1 is a schematic plan view of a related art liquid crystal display panel having a polycrystalline silicon thin film transistor.
Figure 2:
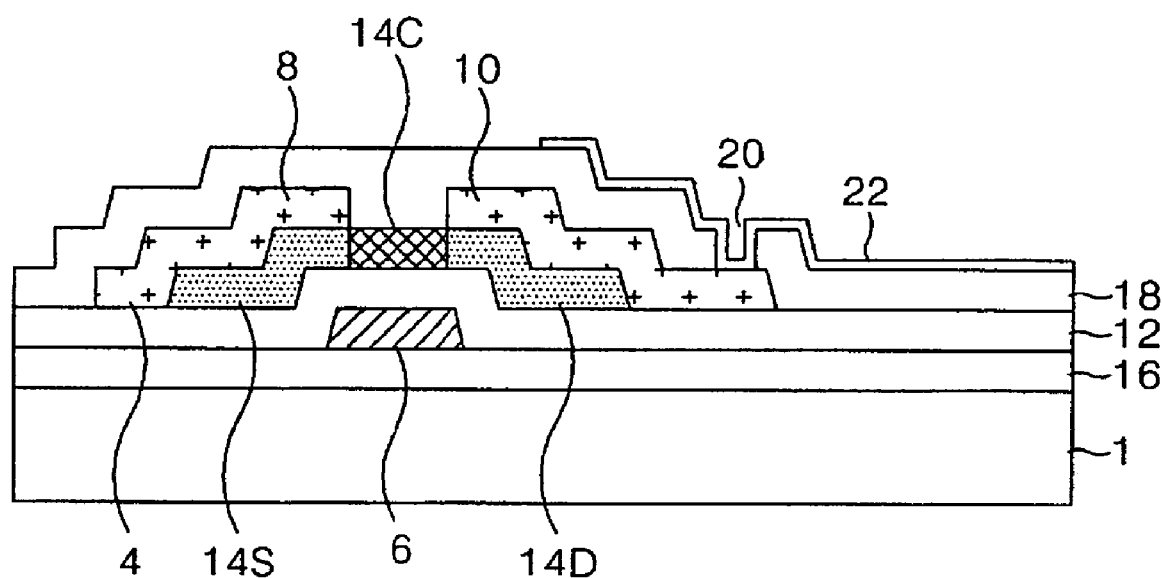
FIG. 2 a sectional view of the liquid crystal display panel taken along the line II–II' in FIG. 1.
Figure 3A:
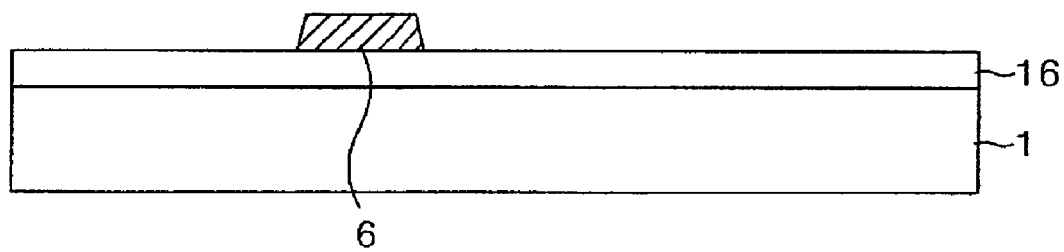
FIGS. 3A to 3F are sectional views of a method of fabricating the liquid crystal display panel in FIG. 2.
Figure 3B:
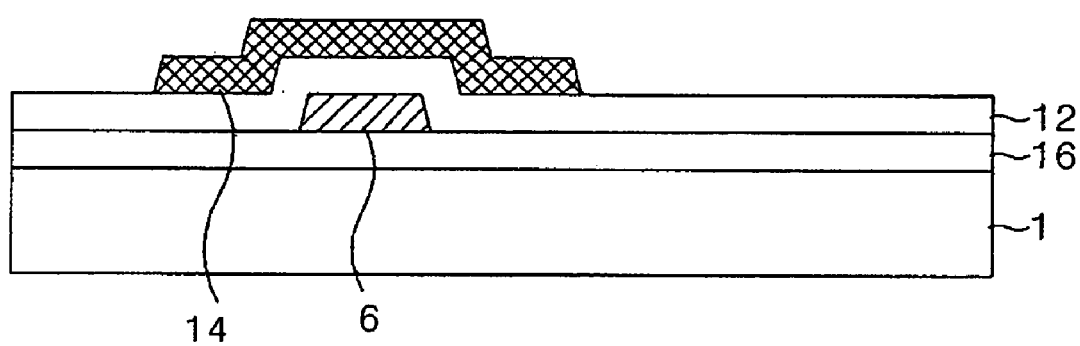
Figure 3C:
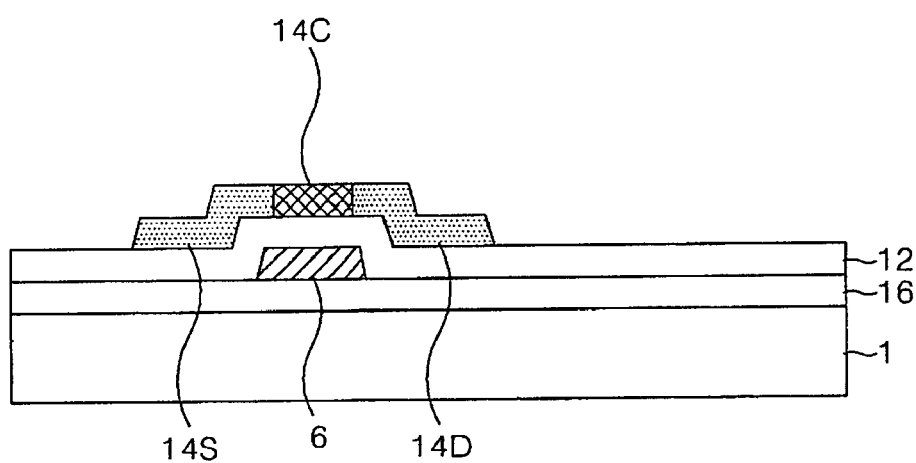
Figure 3D:
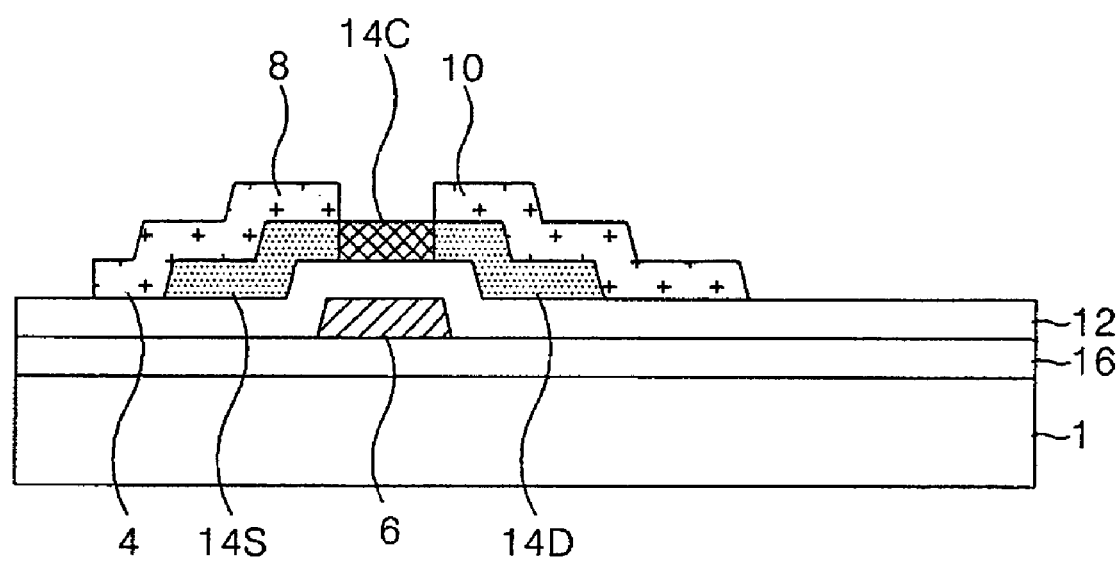
Figure 3E:
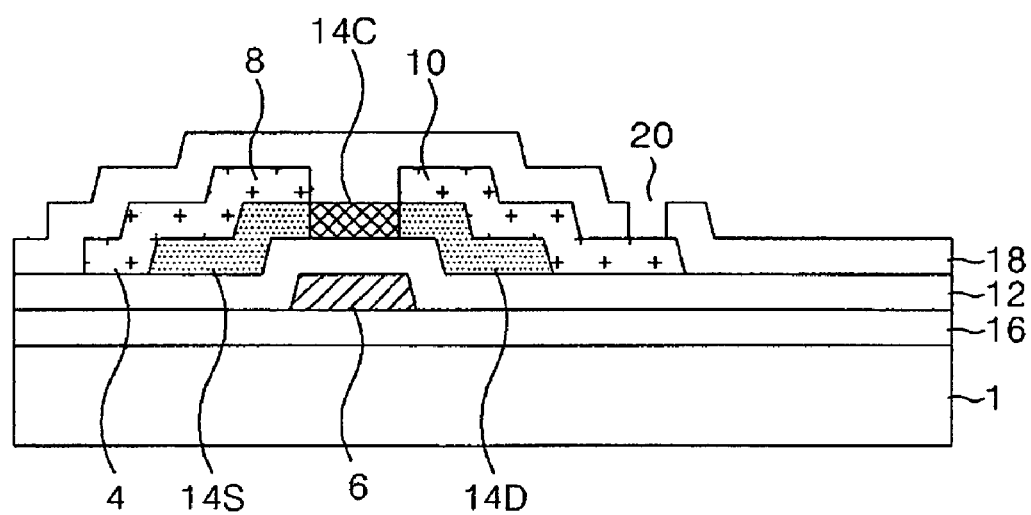
Figure 3F:
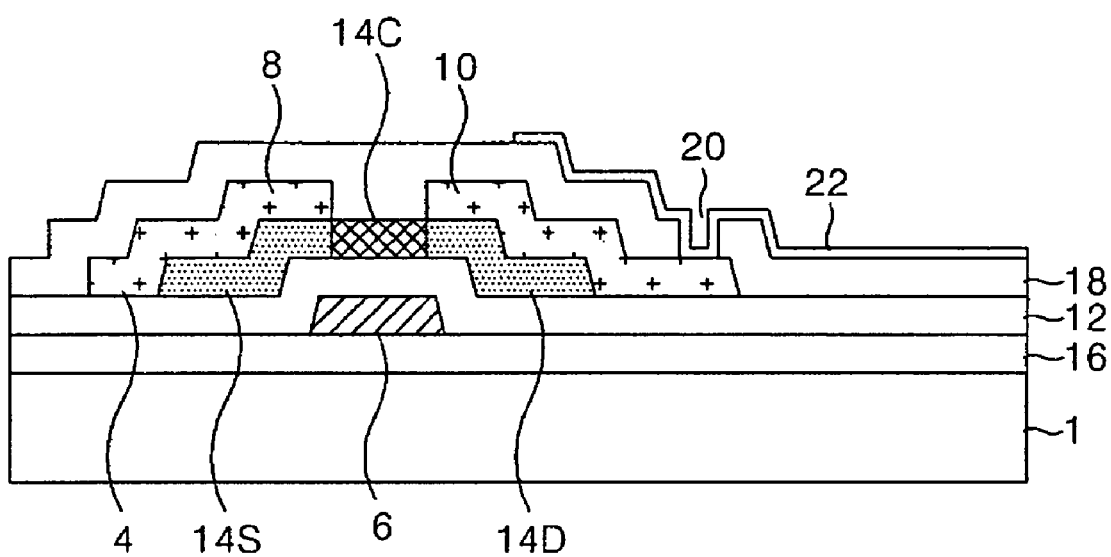
Figure 4:
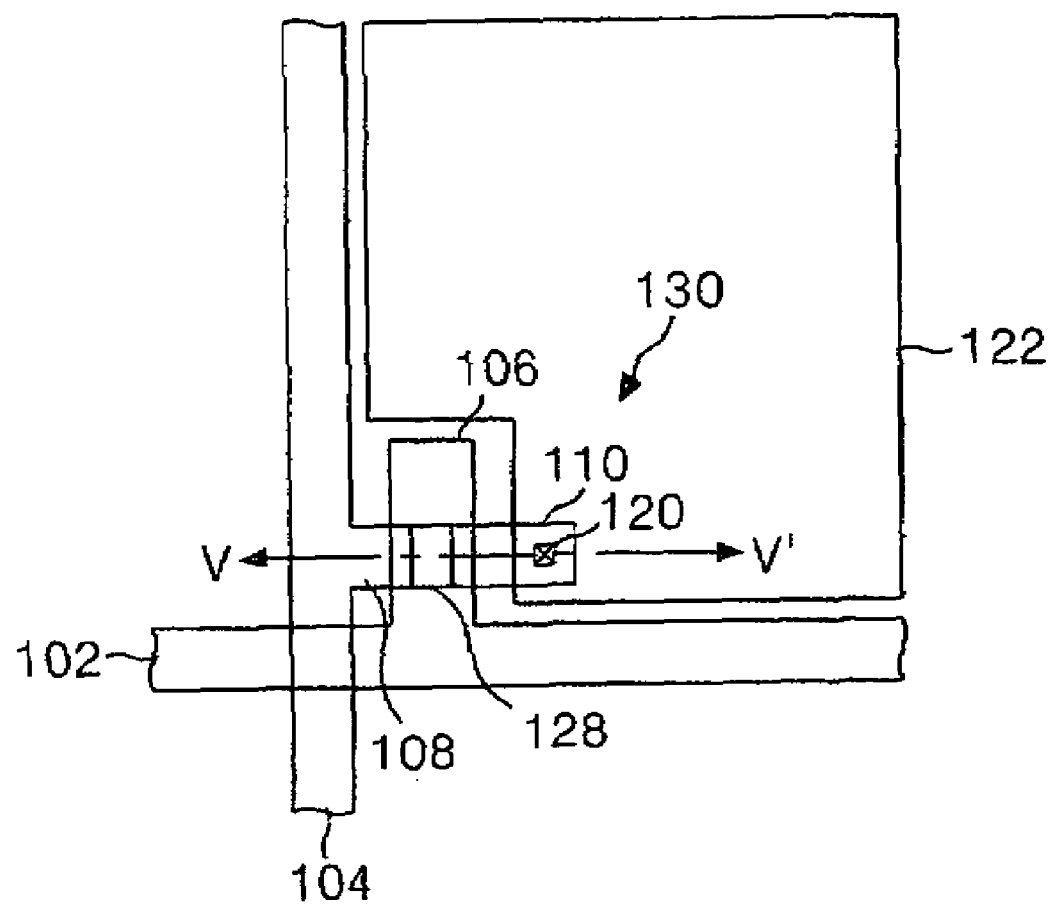
FIG. 4 is a plan view of a liquid crystal display panel having a polycrystalline silicon thin film transistor according to the present invention.
Figure 5:
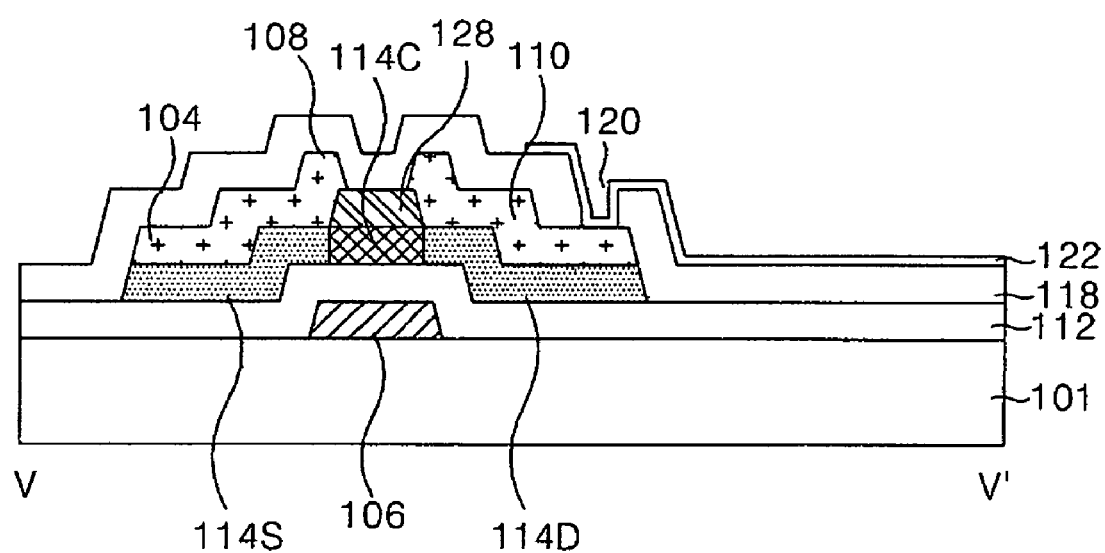
FIG. 5 is a sectional view of the liquid crystal display panel taken along the line V–V' in FIG. 4.

FIG. 4 is a plan view of a liquid crystal display panel having a polycrystalline silicon thin film transistor according to a first embodiment of the present invention, and FIG. 5 is a sectional view of the liquid crystal display panel taken along the line V–V' in FIG. 4.

Referring to FIG. 4 and FIG. 5, a liquid crystal display panel according to the present invention includes a gate line 102, a data line 104 crossing the gate line 102 with an insulating film 112 therebetween, a TFT 130 provided at a crossing of the gate line 102 and the data line 104, and a pixel electrode 122 provided in a pixel area defined by the crossing of the gate line 102 and the data line 104.

The gate line 102 applies a gate signal to a gate electrode 106 of the TFT 130. The data line 104 applies a pixel signal to the pixel electrode 122 via a drain electrode 110 of the TFT 130.

The TFT 130 includes the gate electrode 106 connected to the gate line 102, a source electrode 108 connected to the data line 104, and the drain electrode 110 connected to the pixel electrode 122, via a contact hole 120 passing through a passivation film 118.

The gate electrode 106 is formed on a substrate 101 so as to overlap a channel area 114C of an active layer, with the gate insulating film 112 between the gate electrode 106 and the channel area 114C.

The source electrode 108 is directly connected to a source area 114S of the active layer and the drain electrode 110 is directly connected to a drain area 114D of the active layer.

An insulating pattern 128 is formed to overlap the channel area 114C between the source electrode 108 and the drain electrode 110. The insulting pattern 128 serves to prevent the channel area 114C of the active layer from being over-etched.

The active layer 114 is crystallized from an amorphous silicon film to a poly crystalline silicon film by a Field Enhanced Metal Induced Crystallization (FEMIC) method using a metal catalyst. Different ions, depending on the location of the active layer 114 and type of the TFT 130, are injected into the active layer 114. In other words, if the TFT 130 has an N channel, at least one of $n^+$ and $n^-$ ions is injected into the active layer. The active layer into which $n^-$ ions are injected becomes an LDD area, which is used to reduce the off-current of the TFT 130. The active layer into which $n^+$ ions are injected becomes the source area and the drain area, and the active layer into which the $n^+$ and $n^-$ ions are not injected becomes the channel area. If the TFT 130 has a P channel, $p^+$ ions are injected into the active layer. The active layer into which $p^+$ ions are injected becomes the source area and the drain area, and the portion of the active layer not injected with $p^+$ ions becomes the channel area.

Such a TFT 130 responds to a scanning pulse applied from the gate line 102 to charge a video signal, that is, the pixel signal applied from the data line 104 in a liquid crystal cell. Accordingly, the liquid crystal cell controls a light transmittance in accordance with the charged pixel signal.

As a result, an electric field is formed between the pixel electrode 122 to which the pixel signal is applied via the TFT 130 and a common electrode (not shown), which exists on the other substrate. Liquid crystal molecules between the pixel electrode 122 and the common electrode rotate in response to the electric field due to the dielectric anisotropy of the liquid crystal molecules. The degree of the rotation controls the light transmittance of the pixel area, thereby displaying a picture.

According to the principles of the present invention, an amorphous silicon film is transformed into a polycrystalline silicon film by FEMIC. Accordingly, an expensive laser equipment is not required for the crystallization, thereby increasing productivity.

Figure 6A:
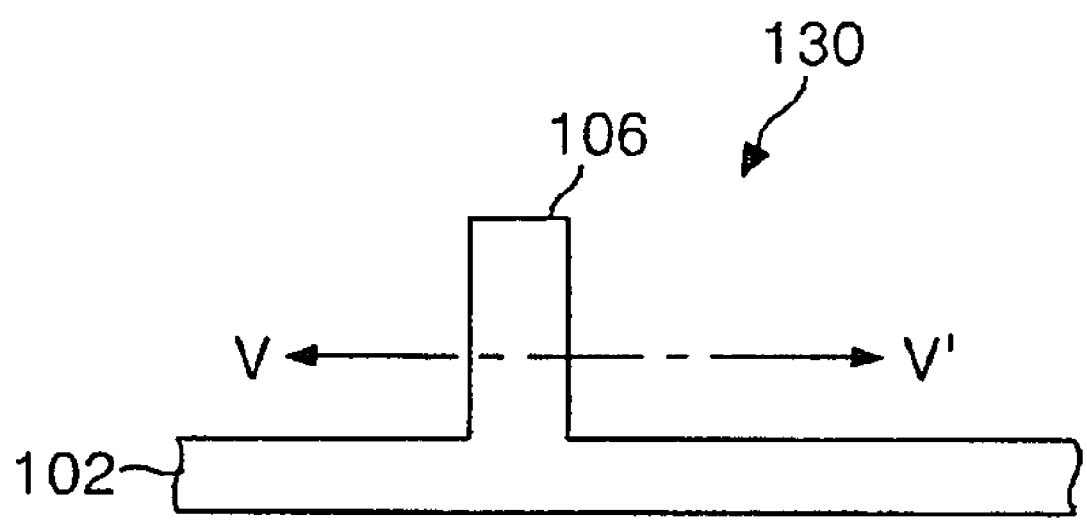
FIGS. 6A and 6B show a plan view and a sectional view illustrating a first mask process according to the present invention.
Figure 6B:
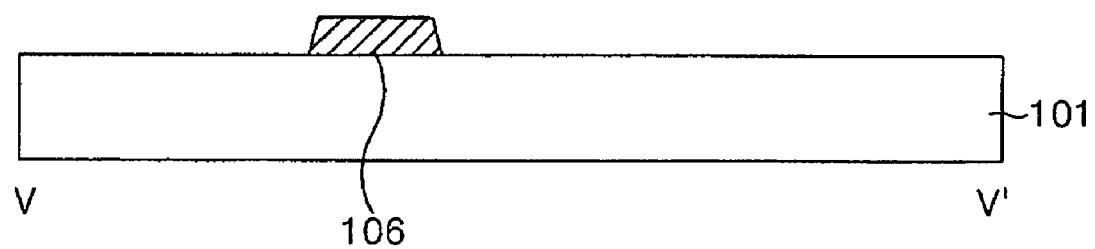

FIGS. 6A and 6B show a plan view and a sectional view illustrating in detail a first mask process according to the present invention.

Referring to FIGS. 6A and 6B, a first conductive patterning group including a gate electrode 106 and a gate line 102 is formed on a substrate 101 by a first mask process.

More specifically, a gate metal layer is entirely deposited on the lower substrate 101 by sputtering. The gate metal layer may be made of a metal including aluminum. The gate metal layer is patterned by a photolithography process and an etching process using the first mask, thereby forming the gate electrode 106 and the gate line 102. A buffer layer may be formed between the first conductive patterning group and the lower substrate 101.

Figure 7A:
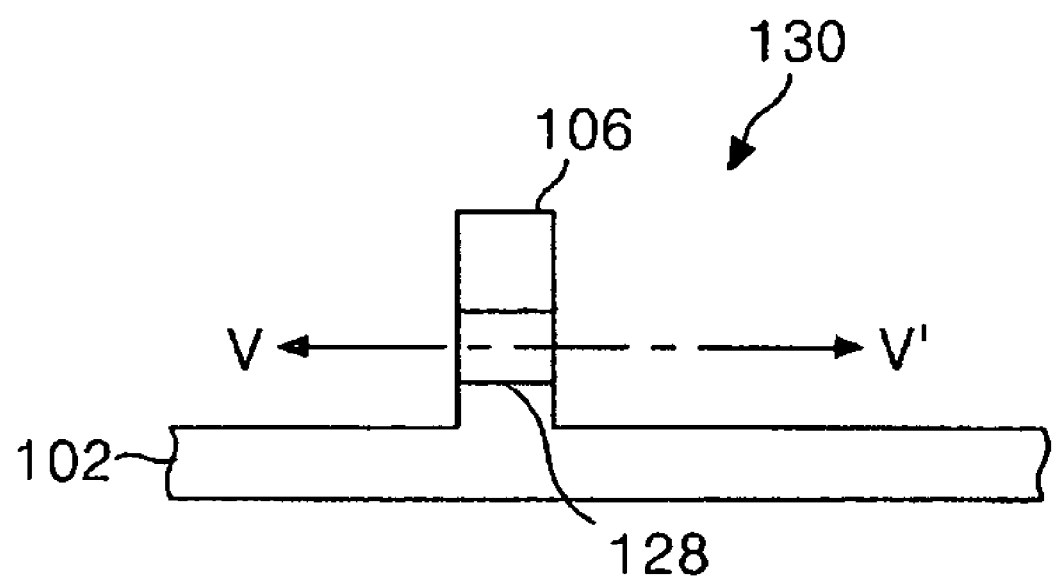
FIGS. 7A and 7B show a plan view and a sectional view illustrating a process for forming an insulating pattern and an active layer according to the present invention.
Figure 7B:
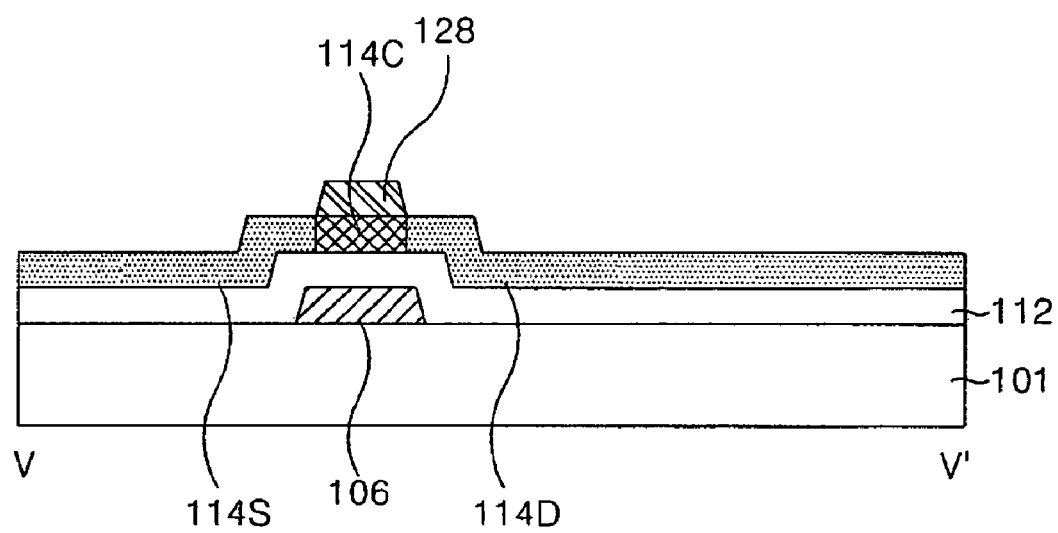

FIGS. 7A and 7B show a plan view and a sectional view illustrating in detail a process for forming an insulating pattern and a polycrystalline silicon layer according to the present invention.

Referring to FIGS. 7A and 7B, a gate insulating film 112 and a polycrystalline silicon film 114 are sequentially formed on the lower substrate 101 with the gate electrode 106 thereon, and an insulating pattern overlapping the gate electrode 106 is formed on the polycrystalline silicon film 114. A detailed description will be made in conjunction with FIGS. 8A to 8G.

Figure 8A:
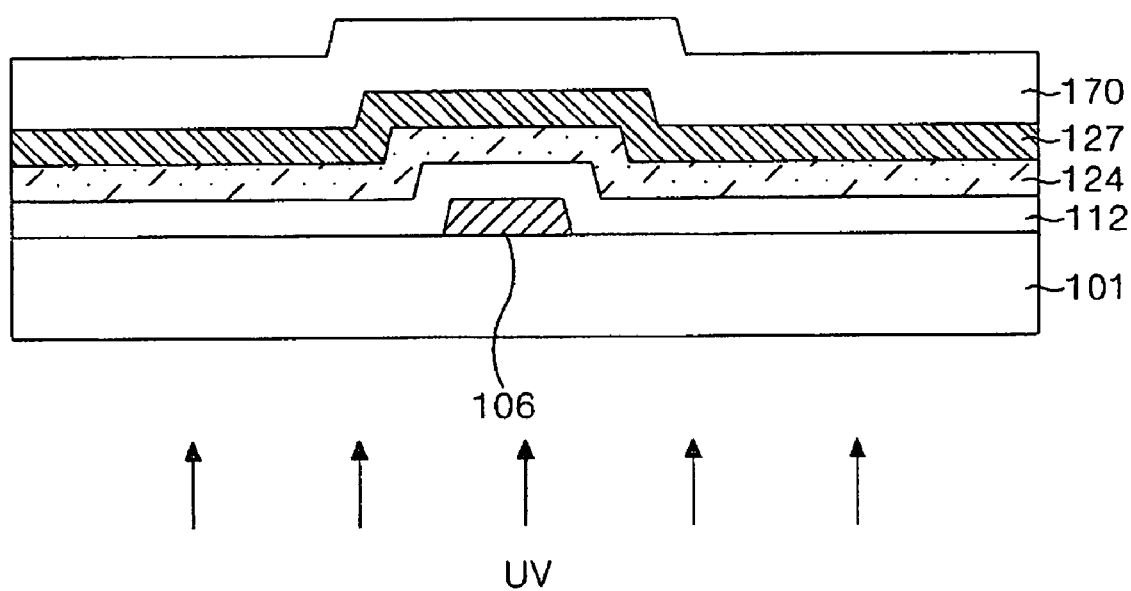
FIGS. 8A to 8G are sectional views illustrating in detail a process for forming an insulating pattern and an active layer.
Figure 8B:
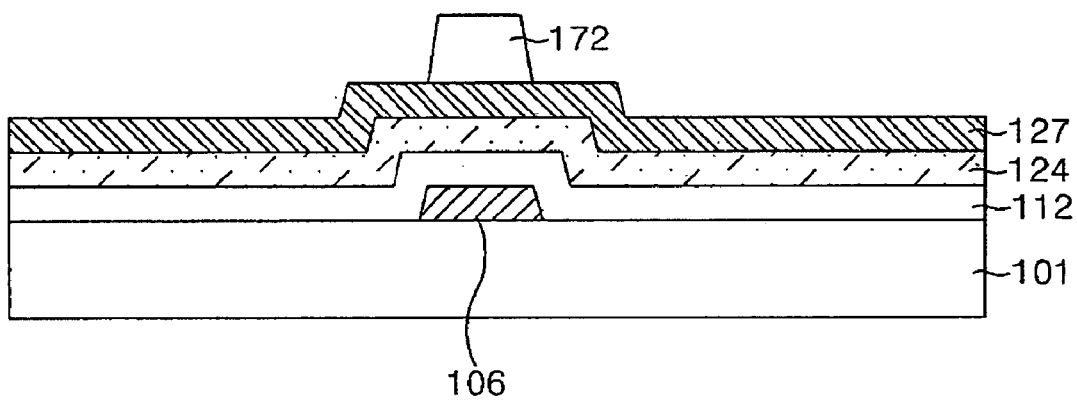
Figure 8C:
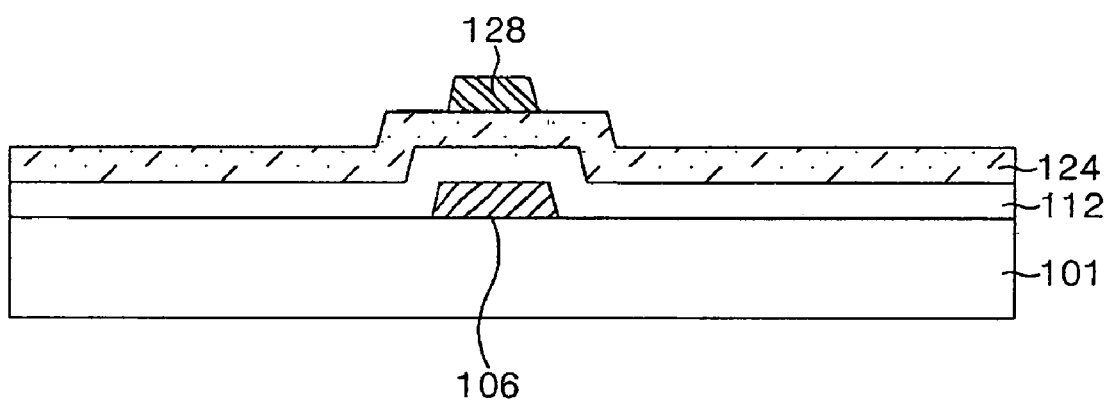

A gate insulating film 112 such as silicon oxide ($SiO_2$) and an amorphous silicon film are sequentially formed on the lower substrate 101 having the first conductive patterning group thereon by a plasma enhanced chemical vapor deposition (PECVD). As shown in FIG. 8A, an insulating material 127 including, for example, silicon oxide (SiOx) or silicon nitride (SiNx), and a photo-resist film 170 are sequentially formed on the lower substrate 101 having the amorphous silicon film thereon. Then, as shown in FIG. 8B, the photo-resist film 170 is formed into a photo-resist pattern 172 by a backside-exposure process wherein a UV light is irradiated onto the photo-resist film 170 from the lower substrate 101. At this time, the gate electrode 106 serves as a mask, and a developing process follows to form the photo-resist pattern 172. After the formation of the photo-resist pattern 172, an insulating pattern 128 is formed by etching the insulating material using the photo-resist pattern 172 as a mask, as shown in FIG. 8C. The insulating pattern 128 is formed to overlap the gate electrode 106, with the gate insulating film 112 and the amorphous silicon film 124 therebetween.

Figure 8D:
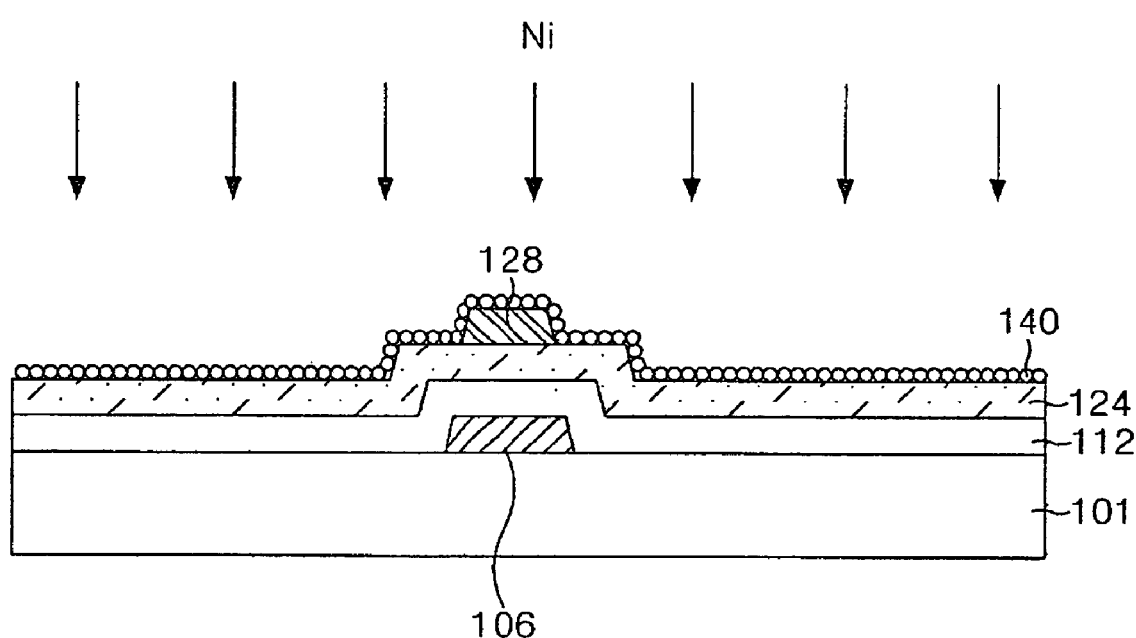

Then, a derivative metal such as nickel (Ni) is deposited on the insulating pattern 128 and the amorphous silicon film 124 by sputtering or PECVD to crystallize the amorphous film 124, as shown in FIG. 8D. In this case, the derivative metal is not formed on the portion of the amorphous silicon film 124 that is covered by the insulating pattern 128.

Figure 8E:
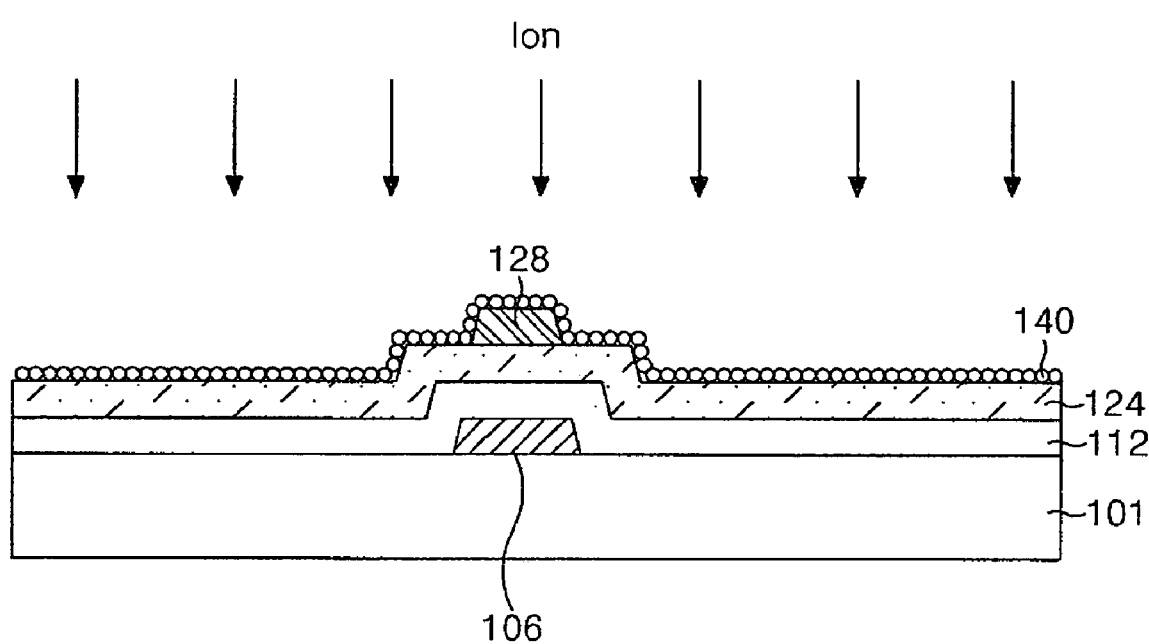

As shown in FIG. 8E, impurity ions corresponding to the type of the TFT 130 are injected into the amorphous silicon film 124 having the deposited derivative metal 140. For instance, in case of an N-type TFT, $n^+$ ions are injected, using the insulating pattern 128 as a mask, into the portion of the amorphous silicon film 124 that does not overlap the gate electrode 106. In case of a P-type TFT, $p^+$ ions are injected, using the insulating pattern 128 as a mask, into the portion of the amorphous silicon film 124 that does not overlap the gate electrode 106.

Figure 8F:
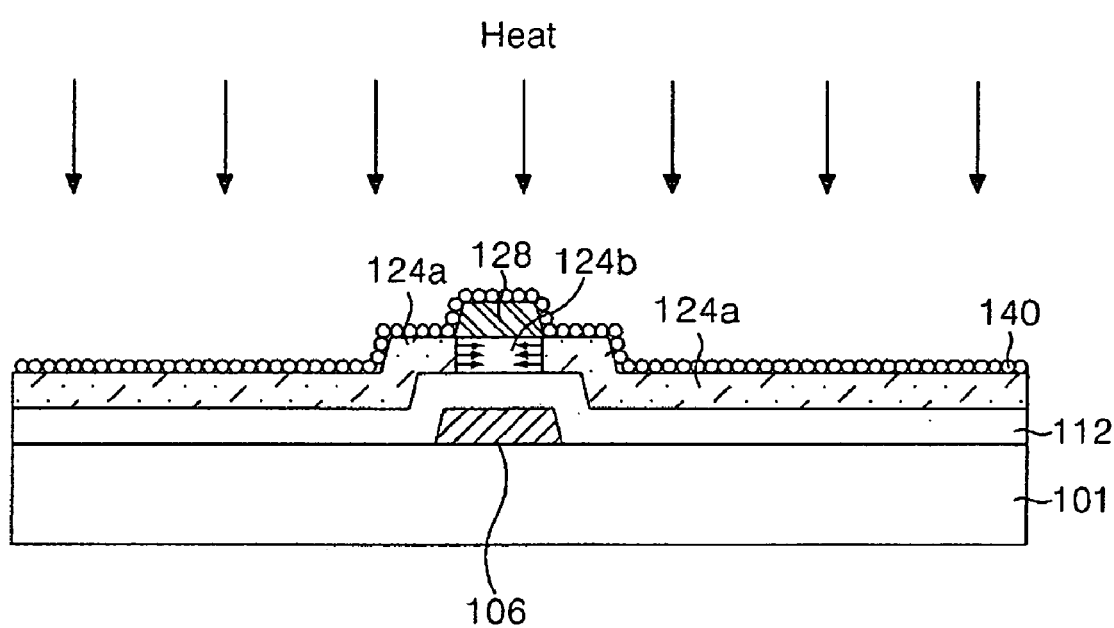

Then, the amorphous film 124 having the derivative metal 140 deposited thereon is subjected to a heat treatment at a predetermined temperature and a predetermined electric field, as shown in FIG. 8F. During this process, the amorphous silicon film 124A having the derivative metal 140 is crystallized by Metal Induced Crystallization (MIC), and the amorphous silicon film 124B without the induced metal 140 is crystallized by Metal Induced Lateral Crystallization (MILC) in which silicide formed by a reaction of the derivative metal 140 and the amorphous silicon film induces the crystallization of the amorphous silicon film, as the silicide continues to diffuse laterally in the amorphous silicon film 124B. In addition, since the heat treatment has a similar process condition to an annealing condition for activating the ions injected into the amorphous silicon film 124, the crystallization process and an ion activation process are performed together at the same time.

Figure 8G:
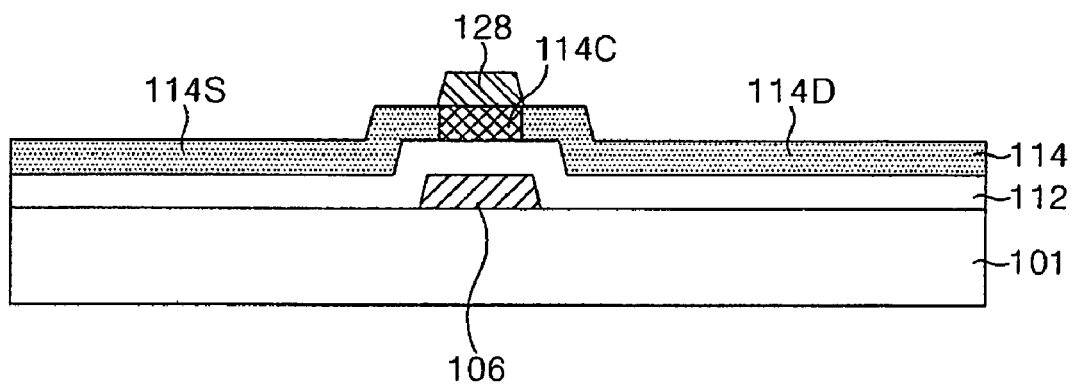

Accordingly, the amorphous silicon film is crystallized into a polycrystalline silicon film by the FEMIC, as shown in FIG. 8G, and the polycrystalline silicon film forms an active layer 114 divided into a source area 114S, a channel area 114C and a drain area 114D depending on the ions injected into the polycrystalline silicon film. Herein, the channel area 114C is the area overlapping the gate electrode 106, while the source area and the drain area are the areas excluding the channel area 114C in the active layer 114.

As mentioned above, the source area 114S and the drain area 114D of the active layer formed by a heat treatment are crystallized using the MIC method as the derivative metal is directly applied to those areas, and the channel area 114C is crystallized by the MILC method.

Figure 9A:
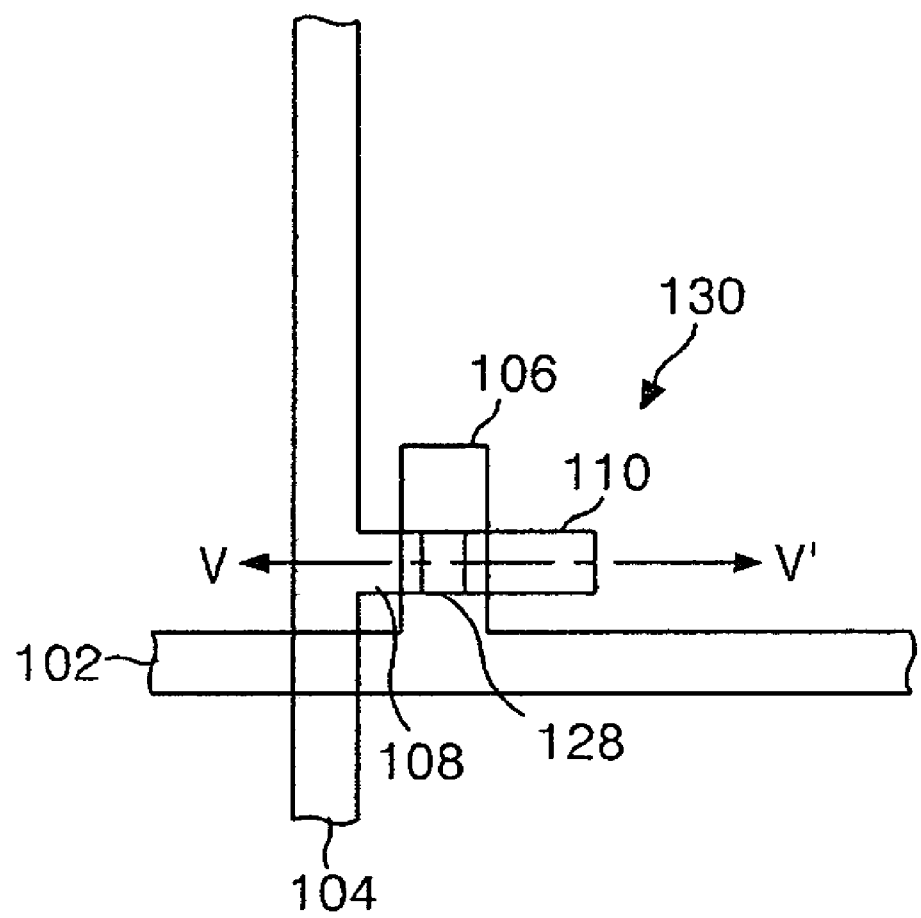
FIGS. 9A and 9B show a plan view and a sectional view illustrating in detail a second mask process according to the present invention.
Figure 9B:
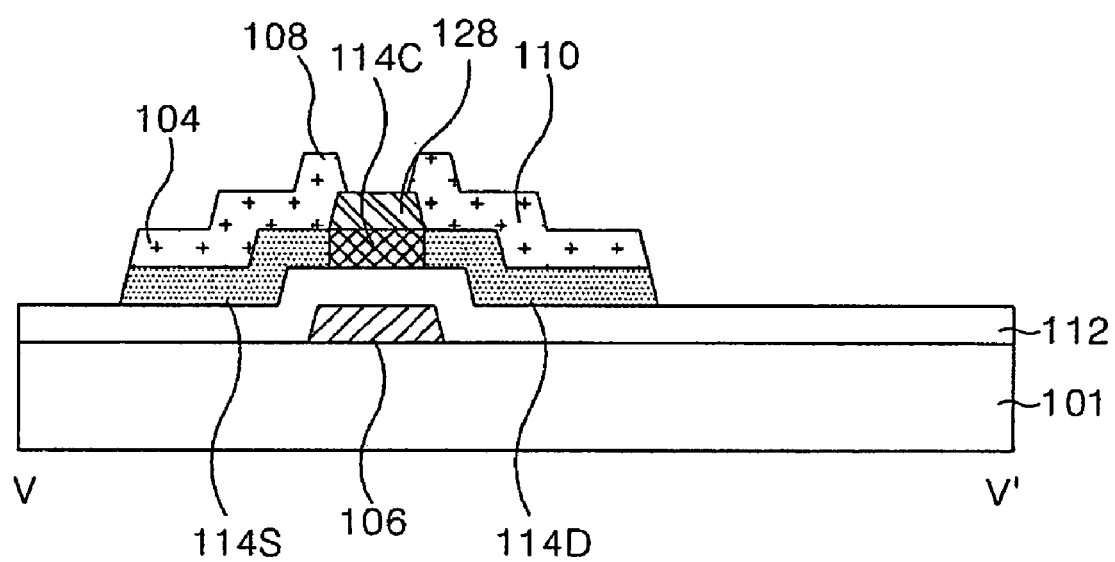

FIGS. 9A and 9B show a plan view and a sectional view illustrating in detail a second mask process according to the present invention.

Referring to FIGS. 9A and 9B, a second conductive patterning group including a data line 104, a source electrode 108 and a drain electrode 110 of the TFT 130, is formed on the lower substrate 101 with a second mask process, and an active layer 114 defining a source area 114S and a drain area 114D are also formed on the lower substrate 101. Such a second mask process will be described in detail referring to FIGS. 10A to 10D.

Figure 10A:
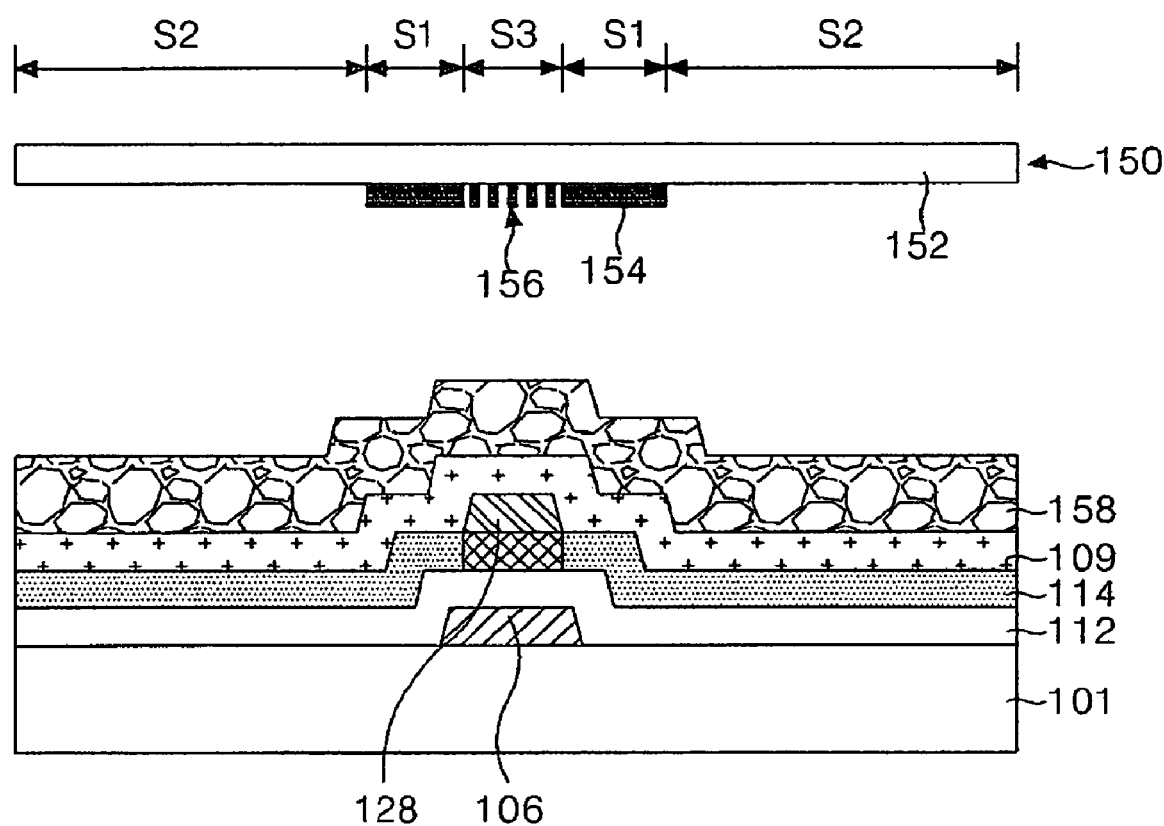
FIGS. 10A to 10D are sectional views illustrating in detail the second mask process in FIG. 9.

As shown in FIG. 10A, a data metal layer 109 is formed on the active layer 114 by a depositing method such as PECVD and sputtering. Herein, the data metal layer 109 may be made of chromium (Cr), copper (Cu), or molybdenum (Mo).

Figure 10B:
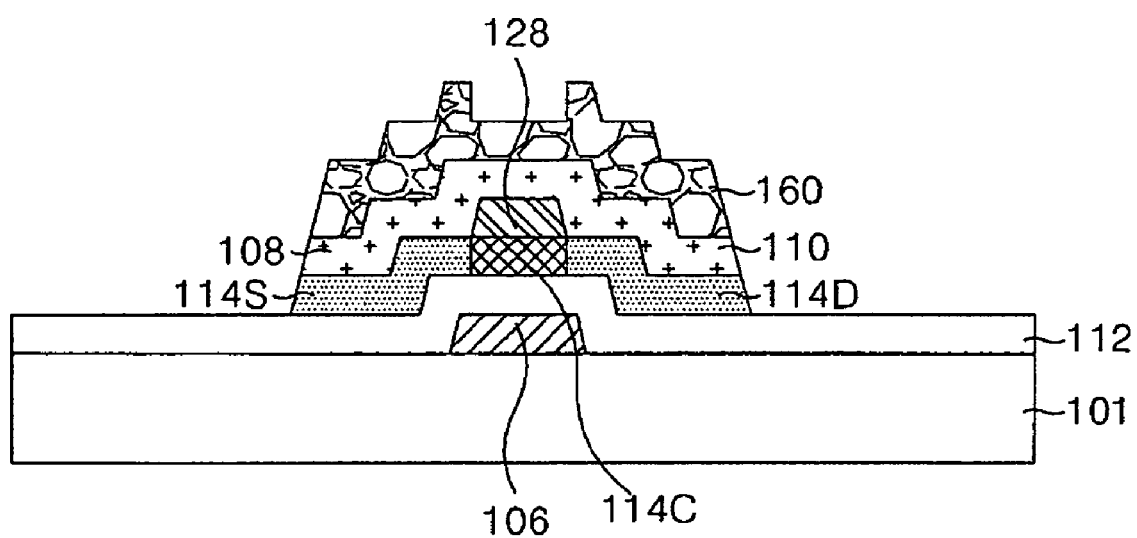

Then, a photo-resist 158 is formed on the data metal layer 109 and a second mask 150 is arranged over the lower substrate 101. The second mask 150 is formed of a transparent material and includes a mask substrate 152 whose exposed area becomes an exposing area S2, a shielding part 154 formed at a shielding area S1 of the mask substrate 152 and a diffractive exposing part 156 (or a semi-transmitting part) formed at a partial exposing area S3 of the mask substrate 152. The photo-resist 158 is exposed and then developed using the second mask 150, to thereby form a photo-resist pattern 160 having a stepped part between the shielding area S1 and the partial exposing area S3 corresponding to the shielding part 154 and the diffractive exposing part 156 as shown in FIG. 10B. In other words, the height of the photo-resist pattern 160 formed at the partial exposing area S3 (second height) is lower than the height of the photo-resist pattern 160 formed at the shielding area S1 (first height).

The data metal layer is patterned by a wet etching process using the photo-resist pattern 160 as a mask, thereby forming a second conductive patterning group including the source and drain electrodes 108 and 110 in the TFT.

Figure 10C:
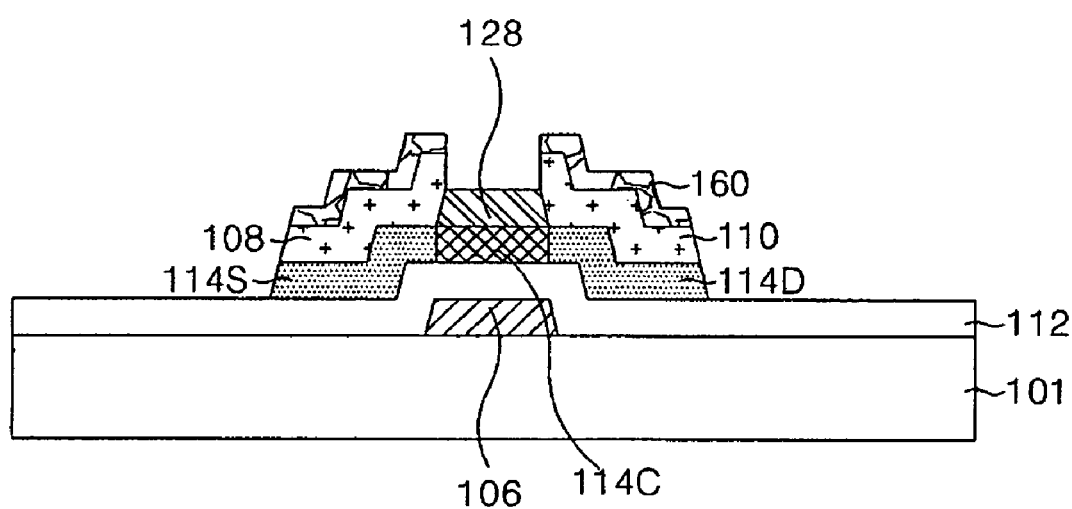
Figure 10D:
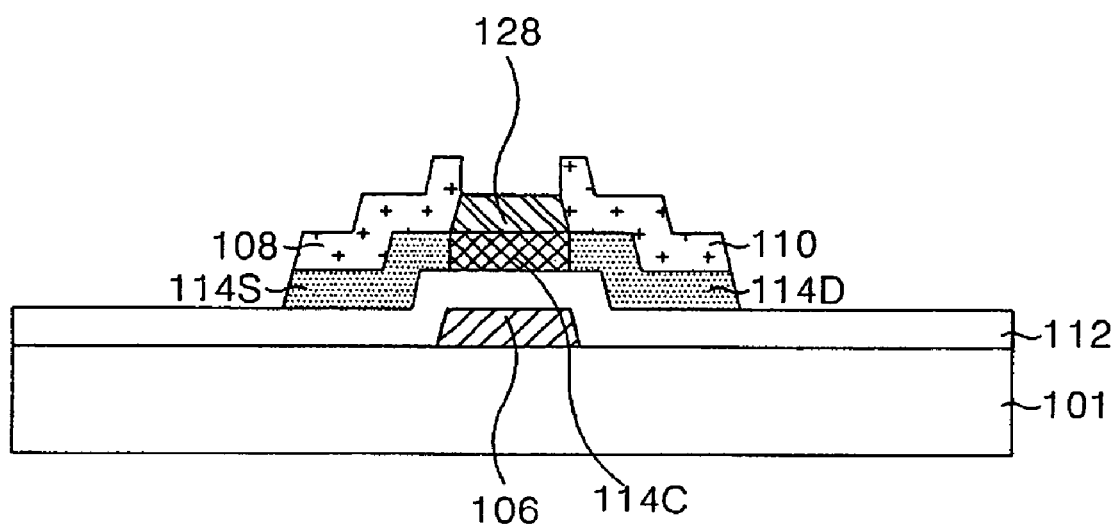

Thereafter, the polycrystalline silicon film is patterned by a dry etching process using the photo-resist pattern 160 as a mask, thereby defining the source area 114S and the drain area 114D of the active layer. Subsequently, the photo-resist pattern 160 having the second height at the partial exposing area S3 is removed by an ashing process using an oxygen ($O_2$) plasma, as shown in FIG. 10C, and the photo-resist pattern 160 having the first height at the shielding area S1 has a lower height. The partial exposing area S3, that is, the data metal layer overlapping the channel area of the TFT is removed by an etching process using the photo-resist pattern 160. Accordingly, the integrated source and drain electrodes 108 and 110 are separated from each other, and thus the insulating pattern 128 overlapping the channel area 114C is exposed. Then, the photo-resist pattern 160 remaining on the conductive patterning group is removed by a stripping process, as shown in FIG. 10D.

Figure 11A:
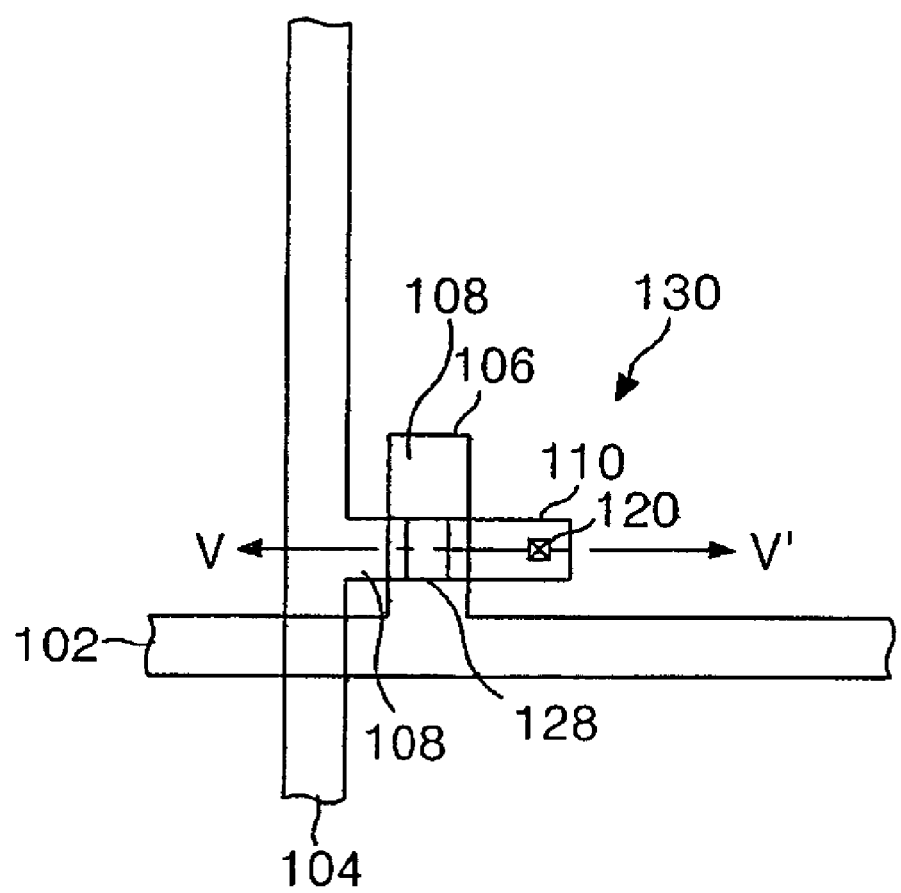
FIGS. 11A and 11B show a plan view and a sectional view illustrating a third mask process according to the present invention.
Figure 11B:
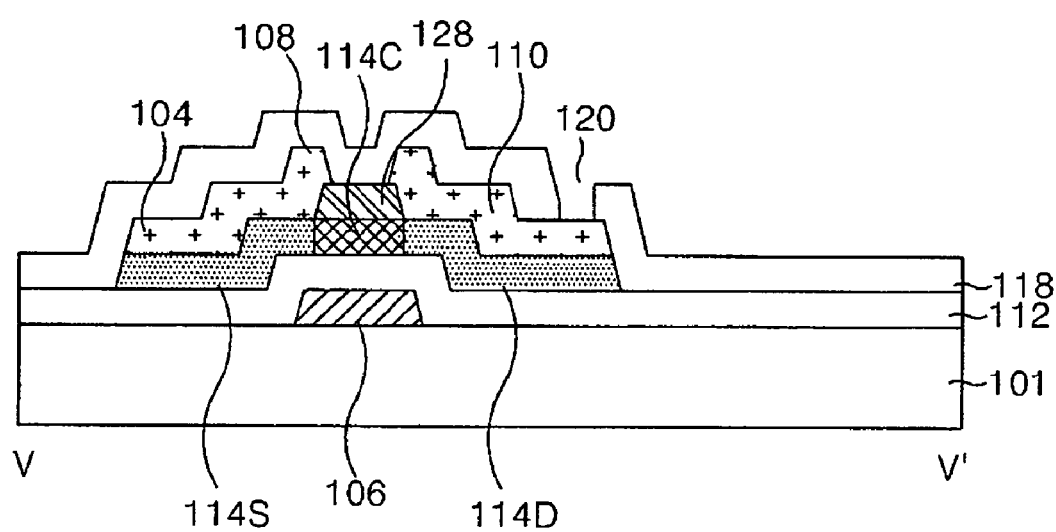

FIGS. 11A and 11B show a plan view and a sectional view illustrating in detail a third mask process according to the present invention.

Referring to FIGS. 11A and 11B, a passivation film 118 having a contact hole 120 is formed on a lower substrate 101 having a second conductive patterning group formed thereon including a source electrode 108 and a drain electrode 110 with a third mask process.

More specifically, an insulating material is entirely deposited on the lower substrate 101 having the source electrode 108 and the drain electrode 110 formed thereon by a depositing method, such as PECVD and sputtering, thereby forming the passivation film 118. Herein, the passivation film 118 is made of either an organic insulating material or an inorganic insulating material such as silicon oxide ($SiO_2$) and silicon nitride (SiNx). Thereafter, a photo-resist is deposited on the lower substrate 101 having the passivation film 118 formed thereon. The photo-resist is then patterned by a photolithography process using a third mask to form a photo-resist pattern. The passivation film 118 is patterned by an etching process using the photo-resist as a mask, thereby forming a contact hole 120 to expose the drain electrode 110.

Figure 12A:
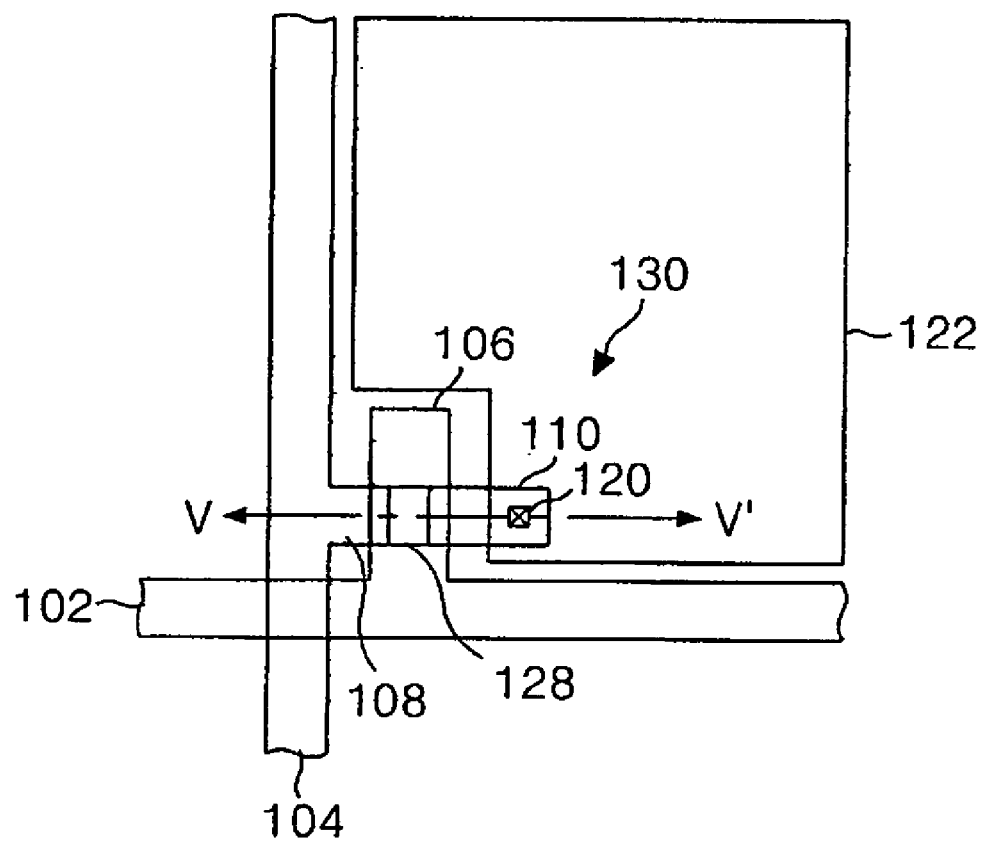
FIGS. 12A and 12B show a plan view and a sectional view illustrating a fourth mask process according to the present invention.
Figure 12B:
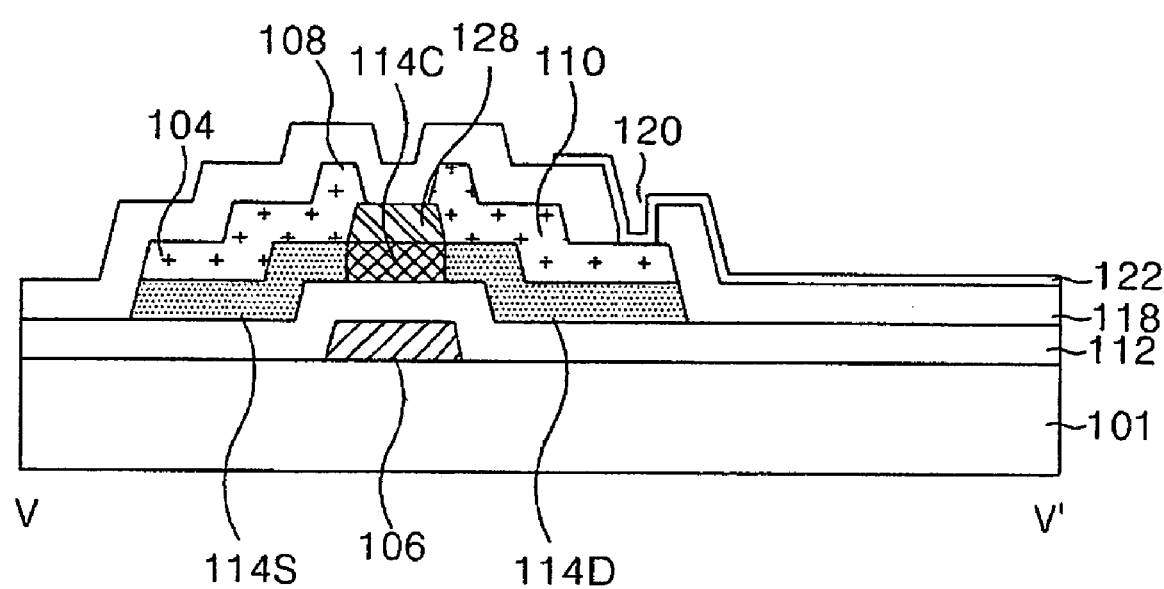

FIGS. 12A and 12B show a plan view and a sectional view illustrating in detail a fourth mask process according to the present invention.

Referring to FIGS. 12A and 12B, a pixel electrode 122 to be located in a pixel region is formed on a lower substrate 101 having a passivation film 118 formed thereon using a fourth mask process.

More specifically, a transparent conductive material and a photo-resist are sequentially deposited on the lower substrate 101 having the passivation film 118 formed thereon by a depositing method such as sputtering. Herein, the transparent conductive material is made of any one of an indium-tin-oxide (ITO), an tin-oxide (TO) and an indium-zinc-oxide (IZO). Then, the photo-resist is patterned by exposing and developing processes using a mask, thereby forming a photo-resist pattern. The transparent conductive material is patterned by an etching process using the photo-resist pattern as a mask, thereby forming a pixel electrode 122. The pixel electrode 122 is connected to a drain electrode 110 of an N-type TFT located at a picture display panel via a contact hole 120.

FIGS. 13A to 13E are sectional views representing another fabricating method of a liquid crystal display panel having a polycrystalline silicon TFT according to the present invention.

Another method of fabricating a liquid crystal display panel having a polycrystalline silicon TFT according to the present invention includes forming a gate pattern by the mask process in FIG. 6; forming an insulating pattern by a mask process in FIGS. 13A to 13E; forming a data pattern and an active layer having an area defined by the mask process in FIG. 9; forming a passivation film having a contact hole by the mask process in FIG. 11; and forming a pixel electrode by the mask process in FIG. 12.

Meanwhile, the mask process forming an insulating pattern will be described in detail in conjunction with FIGS. 13A to 13E.

Figure 13A:
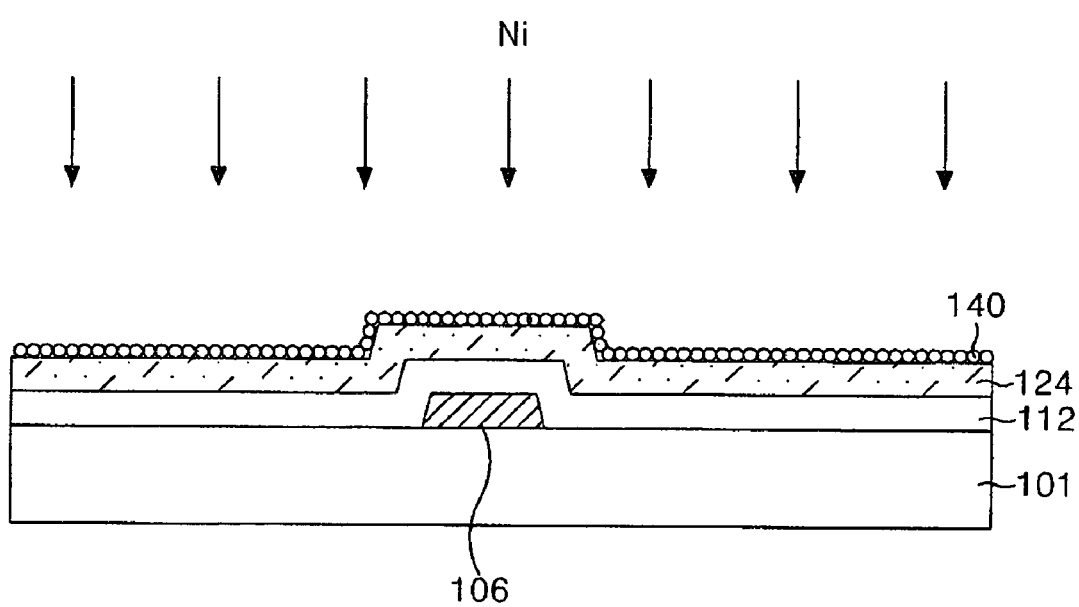
FIGS. 13A to 13E are sectional views illustrating another fabricating process of a liquid crystal display panel having a polycrystalline silicon thin film transistor according to the present invention.

A gate insulating film 112 such as silicon oxide $SiO_2$ and an amorphous silicon film 124 are sequentially deposited on a lower substrate 101 having a gate electrode 106 formed thereon by using PECVD. Then, as shown in FIG. 13A, a derivative metal 140 such as nickel (Ni) is deposited on the amorphous silicon film 124 by sputtering and PECVD to crystallize the amorphous silicon film 124.

Figure 13B:
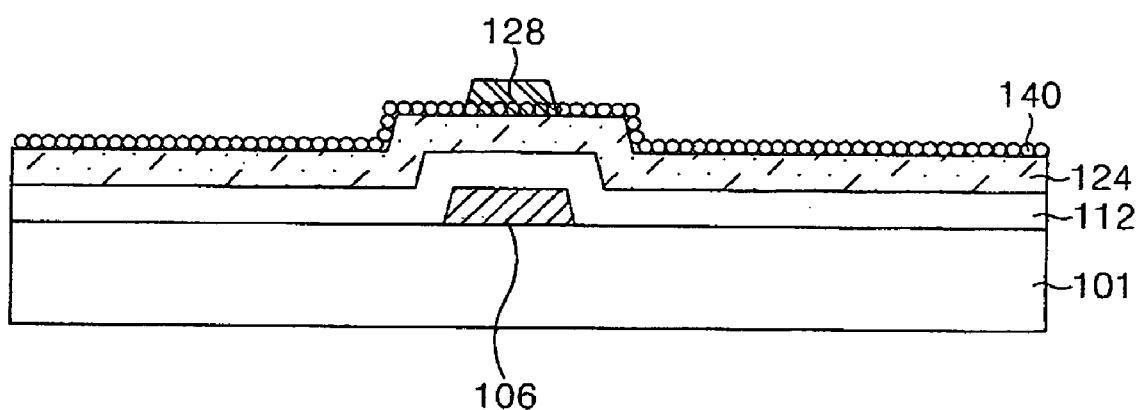

An insulating material including silicon oxide (SiOx) or silicon nitride (SiNx) is deposited on the lower substrate 101 having the derivative metal 140 by PECVD. The insulating material is patterned by photolithography and etching processes, thereby forming an insulating pattern 128 overlapping the gate electrode 106 as shown in FIG. 13B.

Figure 13C:
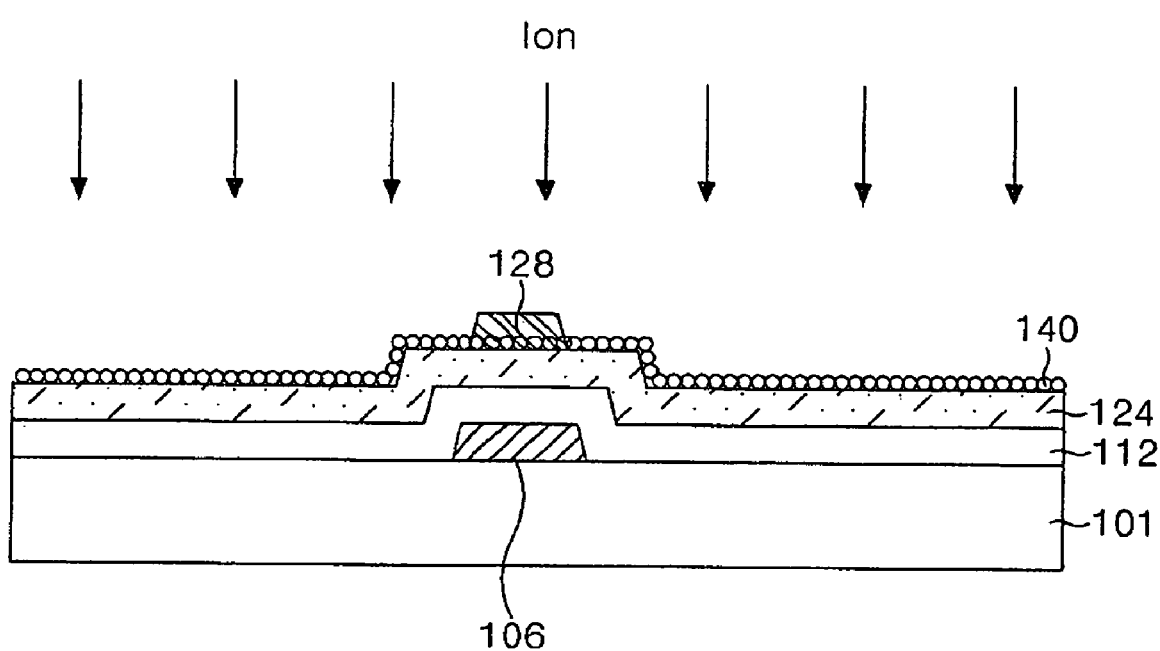

Impurity ions corresponding to the type of the TFT 130 are injected into the amorphous silicon film having the insulating pattern 128, as shown in FIG. 13C. For instance, in case of an N-type TFT, $n^+$ ions are injected into the portion of the amorphous silicon film 124 that does not overlap the gate electrode 106 using the insulating pattern 128 as a mask. In case of a P-type TFT, $p^+$ ions are injected into the amorphous silicon film 124 that does not overlap the gate electrode 106 using the insulating pattern 128 as a mask.

Figure 13D:
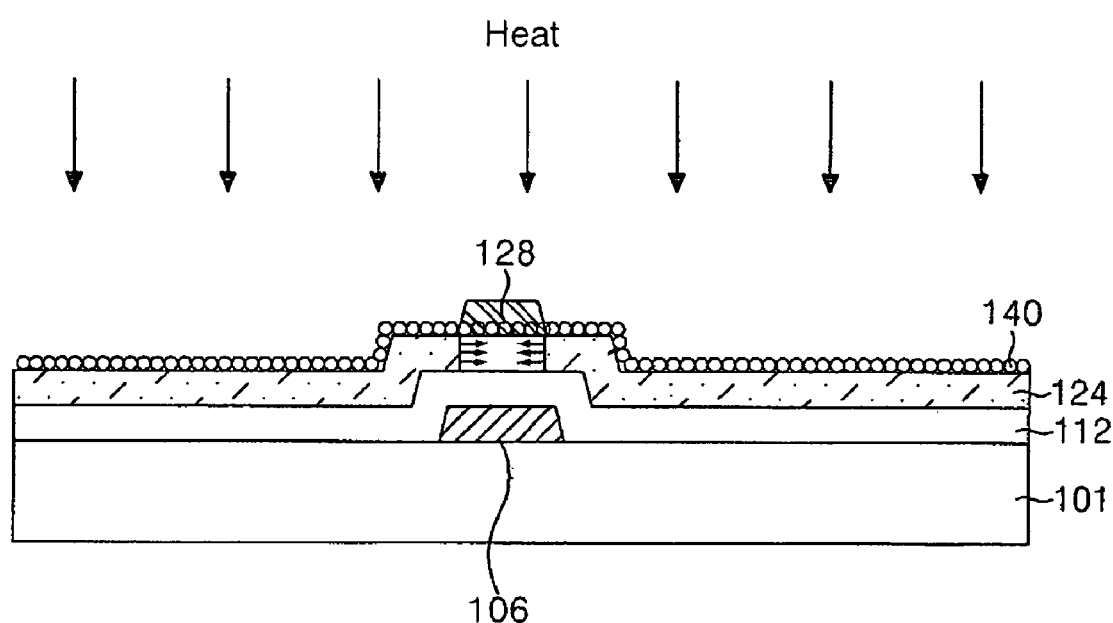

Then, the amorphous silicon film 124 having the derivative metal 140 deposited thereon is subjected to a heat treatment at a predetermined temperature and a predetermined electric field, as shown in FIG. 13D. During this process, the amorphous silicon film 124 to which the derivative metal 140 is applied is crystallized by a Metal Induced Crystallization (MIC) by the heat treatment. Moreover, since the heat treatment has a similar process condition to an annealing condition for activating the ions injected into the amorphous silicon film 124, the crystallization process and an ion activation process are performed together at the same time. Furthermore, the derivative metal 140 within the active layer area overlapping the gate electrode 106 diffuses toward the backside of the substrate 101 by the heat treatment, and concentrates at the substrate 101 neighboring the impurity ions. The derivative metal does not remain within the area overlapping the gate electrode 106 by so-called gettering effect, thereby preventing a leakage current.

Figure 13E:
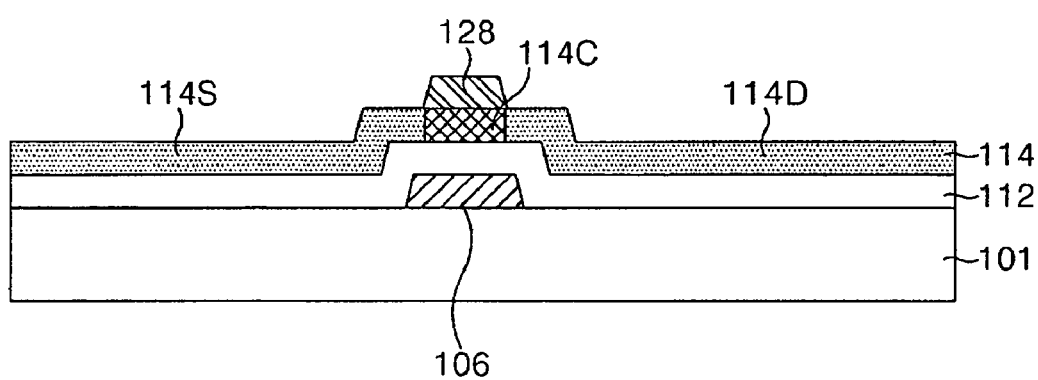

Accordingly, the amorphous silicon film is crystallized into a polycrystalline silicon film by FEMIC, as shown in FIG. 13E, and the polycrystalline silicon film is divided into a source area 114S, a channel area 114C and a drain area 114D depending on the ions injected into the polycrystalline silicon film. The source area 114S and the drain area 114D of the active layer formed by the heat treatment are crystallized by FEMIC as the derivative metal is directly applied to those areas.

As described above, in the liquid crystal display panel and the fabricating method thereof according to the present invention, the ion injection process and the crystallization process are accomplished by the backside-exposure using the gate electrode as a mask, thereby forming the liquid crystal display panel using the four mask process. As a result, the number of masks and costs are reduced. Since the crystallization process is accomplished by FEMIC, an expensive laser equipment is not required, thereby increasing productivity.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display panel, comprising:
   a gate electrode on a substrate;
   a gate insulation layer on the gate electrode;
   an active pattern having a channel area and source drain areas, the channel area overlapping the gate electrode;
   an insulating pattern overlapping the channel area of the active pattern on the active pattern, wherein the insulating pattern includes a metal being diffused into the insulating pattern during a heat treatment; and
   source and drain electrodes contacting the source and drain areas of the active pattern, respectively.

2. The liquid crystal display panel according to claim 1, wherein the active layer is crystallized into polycrystalline silicon using the metal under the heat treatment.

3. The liquid crystal display panel according to claim 2, wherein an electric field is further applied to the active layer during the crystallization, along with the heat treatment.

4. The liquid crystal display panel according to claim 1, wherein the metal includes nickel (Ni).

5. The liquid crystal display panel according to claim 1, wherein the source and drain areas of the active pattern are crystallized by Metal Induced Crystallization (MIC) and the channel area of the active pattern are crystallized by Metal Induced Lateral Crystallization (MILC).

6. The liquid crystal display panel according to claim 1, wherein the source and drain electrodes are formed using a mask having a diffractive exposing part.

7. The liquid crystal display panel according to claim 1, wherein the insulating pattern is formed using the gate electrode as a mask.

* * * * *